(12) United States Patent
Cho

(10) Patent No.: US 8,017,417 B1
(45) Date of Patent: Sep. 13, 2011

(54) LIGHT EMITTING DIODE HAVING A WAVELENGTH SHIFT LAYER AND METHOD OF MANUFACTURE

(75) Inventor: Byoung gu Cho, Seoul (KR)

(73) Assignee: Lightizer Korea Co., Seoul (KR)

( * ) Notice: Subject to any disclaimer, the term of this patent is extended or adjusted under 35 U.S.C. 154(b) by 0 days.

(21) Appl. No.: 12/750,816

(22) Filed: Mar. 31, 2010

(51) Int. Cl.
H01L 21/00 (2006.01)

(52) U.S. Cl. ............ 438/26; 438/29; 438/110; 438/116; 438/127

(58) Field of Classification Search .................. None
See application file for complete search history.

(56) References Cited

U.S. PATENT DOCUMENTS

| | | |
|---|---|---|
| 6,650,044 B1 | 11/2003 | Lowery |
| 7,598,528 B2 * | 10/2009 | Oh et al. ........................ 257/88 |
| 2008/0150416 A1 * | 6/2008 | Maruyama et al. ........... 313/503 |
| 2008/0173884 A1 | 7/2008 | Chitnis et al. |
| 2008/0179611 A1 | 7/2008 | Chitnis et al. |
| 2009/0057690 A1 | 3/2009 | Chakraborty |
| 2009/0065790 A1 | 3/2009 | Chitnis et al. |
| 2010/0155750 A1 * | 6/2010 | Donofrio ........................ 257/91 |

* cited by examiner

Primary Examiner — Scott B Geyer
(74) Attorney, Agent, or Firm — Ronald A. D'Alessandro; Keohane & D'Alessandro PLLC

(57) ABSTRACT

Embodiments of the present invention provide an LED having a Wavelength Shift Layer (WSL) and method of manufacture. Specifically, under embodiment of the present invention, a WSL layer is applied over an LED chip. The WSL itself typically comprises two layers: an adhesion layer applied over a set (at least one) of LED chips, and a conformal coating over the adhesion layer. The adhesion layer provides improved adhesive effect of the conformal coating to the LED chip(s). The conformal coating is comprised of a particular phosphor ratio that is determined based on a wavelength measurement of the underlying LED chip(s). Specifically, under the present invention, a wavelength of a light output by an LED chip(s) (e.g., blue or ultra-violet (UV)) is measured (e.g., at the wafer level). Typically, the phosphor ratio of is comprised of at least one of the following colors: yellow, green, or red. Regardless, this conformal coating is applied over a glue layer that itself is applied over the LED chip.

10 Claims, 8 Drawing Sheets

LED Wafer

Paraffin dam formation
(dispensing or printing method)

- PRIOR ART -

LIGHT EMITTING DIODE HAVING A WAVELENGTH SHIFT LAYER AND METHOD OF MANUFACTURE

CROSS-REFERENCE TO RELATED INVENTION

The present invention is related in some aspects to commonly-owned and co-pending U.S. patent application Ser. No. 12/693,632, filed Jan. 26, 2010, and entitled LIGHT EMITTING DIODE (LED) AND METHOD OF MANUFACTURE, the entire contents of which are herein incorporated by reference. The present invention is also related in some aspects to commonly-owned and co-pending U.S. patent application Ser. No. 12/750,823, filed Mar. 31, 2010 and entitled MULTICHIP LIGHT EMITTING DIODE (LED) AND METHOD OF MANUFACTURE, the entire contents of which are herein incorporated by reference.

FIELD OF THE INVENTION

The present invention generally relates to Light Emitting Diodes (LEDs). Specifically, the present invention relates to the manufacture of an LED having a Wavelength Shift Layer (WSL).

BACKGROUND OF THE INVENTION

As LEDs continue to grow in popularity as an efficient technological approach, the need for continued advancement grows as well. Along these lines, obtaining white light output from LED is not only needed, but also difficult to achieve. Many approaches in the past have attempted to find new ways to obtain white light. However, many of these approaches perform such processing at the chip level instead of at the wafer level. Such an approach can result in chip waste. Moreover, none of the existing approaches vary phosphor ratios based on an underlying device measurement (such as a wavelength of a light output). For example, U.S. Pat. No. 6,650,044 forms a pedestal on top of a pad. The pedestal is a stud bump that is used for connectivity. This approach is not ideal as it is inefficient, does not provide chip level coating, is much harder to polish, and is easily contaminated. In view of the foregoing, there exists a need for an LED and associated method of manufacture that addresses the deficiencies of the related art.

SUMMARY OF THE INVENTION

In general, embodiments of the present invention provide an LED having a Wavelength Shift Layer (WSL) and method of manufacture. Specifically, under embodiment of the present invention, a WSL layer is applied over an LED chip. The WSL itself typically comprises two layers: an adhesion layer applied over a set (at least one) of LED chips, and a conformal coating over the adhesion layer. The adhesion layer provides improved adhesive effect of the conformal coating to the LED chip(s). The conformal coating is comprised of a particular phosphor ratio that is determined based on a wavelength measurement of the underlying LED chip(s). Specifically, under the present invention, a wavelength of a light output by an LED chip(s) (e.g., blue or ultra-violet (UV)) is measured (e.g., at the wafer level). Typically, the phosphor ratio is comprised of at least one of the following colors: yellow, green, or red. Regardless, this conformal coating is applied over a glue layer that itself is applied over the LED chip.

In one embodiment, an additional protective layer can be applied over the WSL (i.e., over the conformal coating). Regardless, the light output of the LED chip is converted to white light using the WSL. In a typical embodiment, these steps are performed at the wafer level so that uniformity and consistency in results can be better obtained. Moreover, any quantity of chips (i.e., at least one or a "set") can be simultaneously coated hereunder. However, it should be understood that the same teachings could be applied at the chip level. Moreover, several different approaches can be implemented for isolating the coating area. Examples include the use of a paraffin wax, a silk screen, or a photo resist.

A first aspect of the present invention provides a method for manufacturing a light emitting diode (LED), comprising: taking a measurement for a set of LED chips; applying an adhesion layer over the set of LED chips; applying a conformal coating over the conformal coating having a phosphor ratio that is based on the measurement; and converting a light output of the set of LED chips to white light using the conformal coating.

A second aspect of the present invention provides a method for manufacturing a light emitting diode (LED), comprising measuring a wavelength of a light output by a set of LED chips; applying an adhesion layer over the set of LED chips, the adhesion layer comprising an adhesive selected from a group consisting of: a silicon resin, an epoxy resin, an organic polymer, and a glass resin; applying a conformal coating to the set of LED chips, the conformal coating having a phosphor ratio that is based on the wavelength, and the phosphor ratio comprised of at least one of the following colors: yellow, green, or red; and converting the light output of the set of LED chips to white light using the conformal coating.

A third aspect of the present invention provides a light emitting diode (LED), comprising: a set of LED chips; an adhesion layer over the set of set of LED chips; and a conformal coating over the adhesion layer, the conformal coating having a phosphor ratio that is based on a wavelength of a light output by the underlying set of LED chips, wherein the conformal coating converts the light output of the set of LED chips to white light using the conformal coating.

BRIEF DESCRIPTION OF THE DRAWINGS

These and other features of this invention will be more readily understood from the following detailed description of the various aspects of the invention taken in conjunction with the accompanying drawings in which.

Figure 1:
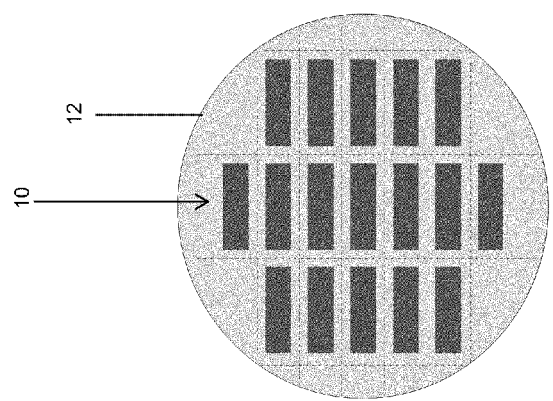
FIG. 1 depicts a chip wavelength distribution graph in the LED chip wafer.
Figure 1:
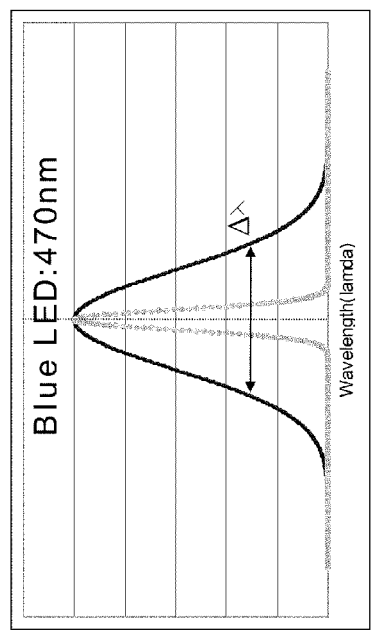

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, embodiments of the present invention provide an LED having a Wavelength Shift Layer (WSL) and method of manufacture. Specifically, under embodiment of the present invention, a WSL layer is applied over an LED chip. The WSL itself typically comprises two layers: an adhesion layer applied over a set (at least one) of LED chips, and a conformal coating over the adhesion layer. The adhesion layer provides improved adhesive effect of the conformal coating to the led chip(s). The conformal coating is comprised of a particular phosphor ratio that is determined based on a wavelength measurement of the underlying LED chip(s). Specifically, under the present invention, a wavelength of a light output by an LED chip(s) (e.g., blue or ultra-violet (UV) is measured (e.g., at the wafer level). Typically, the phosphor ratio is comprised of at least one of the following colors: yellow, green, or red. Regardless, this conformal coating is applied over an adhesion layer that itself is applied over the LED chip.

In one embodiment, an additional protective layer can be applied over the WSL (i.e., over the conformal coating). Regardless, the light output of the LED chip is converted to white light using the WSL. In a typical embodiment, these steps are performed at the wafer level so that uniformity and consistency in results can be better obtained. Moreover, any quantity of chips (i.e., at least one or a "set") can be simultaneously coated hereunder. However, it should be understood that the same teachings could be applied at the chip level. Moreover, several different approaches can be implemented for isolating the coating area. Examples include the use of a paraffin wax, a silk screen, or a photo resist.

A wavelength distribution exists due to an EPI in-line MOCVD (metal organic chemical vapor deposition) process drift and facility deviation of the LED chip between each chip within a LED chip wafer. FIG. 1 depicts the result of measuring the wavelength of blue light for chips 10 within an arbitrary LED chip wafer 12. In FIG. 1, chips are unable to have the same monochromatic light output within the wafer and it has a distribution between chips. In general, in the case of the wave length, a difference is generated between chips that is over 5 nm, and the recognition capability is that of human vision.

Figure 2:
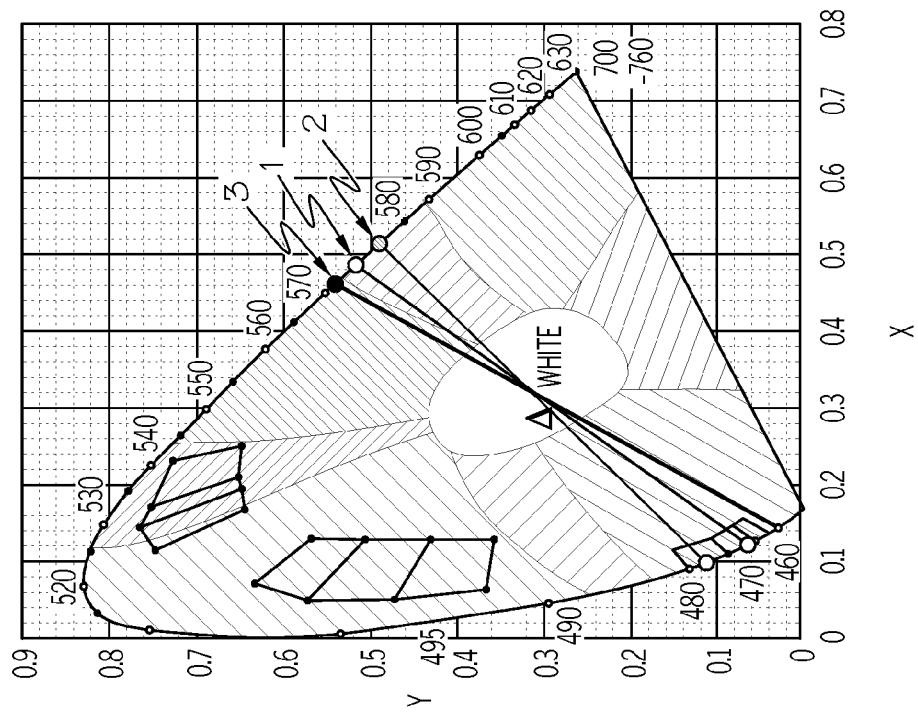
FIG. 2 depicts a graphic representation of the chromaticity diagram.

FIG. 2 shows a RGB chromaticity diagram. Because the wavelength distribution exists similar to FIG. 1 within the wafer between chips, in the case of applying a fluorescent substance of an identical combination ratio in the wafer level in order to implement white, the white color output coordinate is changed on each chip. That is, the wavelength dissemination of the white chip is enlarged.

Therefore, only when the combination ratio of the fluorescent substance applied according to the wavelength of the chip is appropriate, the same target white chip implementation is possible. In the chromaticity diagram of FIG. 2, the wavelength of chip number 1 is $\alpha$. This ratio of yellow, red, and green (Y, R, G) should be applied according to combination ratio A of the fluorescent substance and silicon to form the white target color output coordinate. Moreover, as to chip numbers 2 and 3, the wavelengths of $\beta$ and $\gamma$ need be applied. To form the same white target color output coordinate as chip number 1, ratios of B and C have to be applied to chip numbers 2 and 3 (respectively).

If the combination ratio of the coating film (fluorescent substance plus silicon) is identical for $\alpha$, $\beta$, $\gamma$ in which the chips are different wavelengths, then the white target color output coordinate of the three chips will be different. There is a difficulty in the BLU (back light unit), and a lamp in the LED application with the color dispersion occurrence in the product configuration if the white color output coordinate is changed. Before implementing the dispensing process of coating the fluorescent substance, the sorting (or ranking) is made of the chips for each wavelength of the blue light output from the chips.

Figure 3:
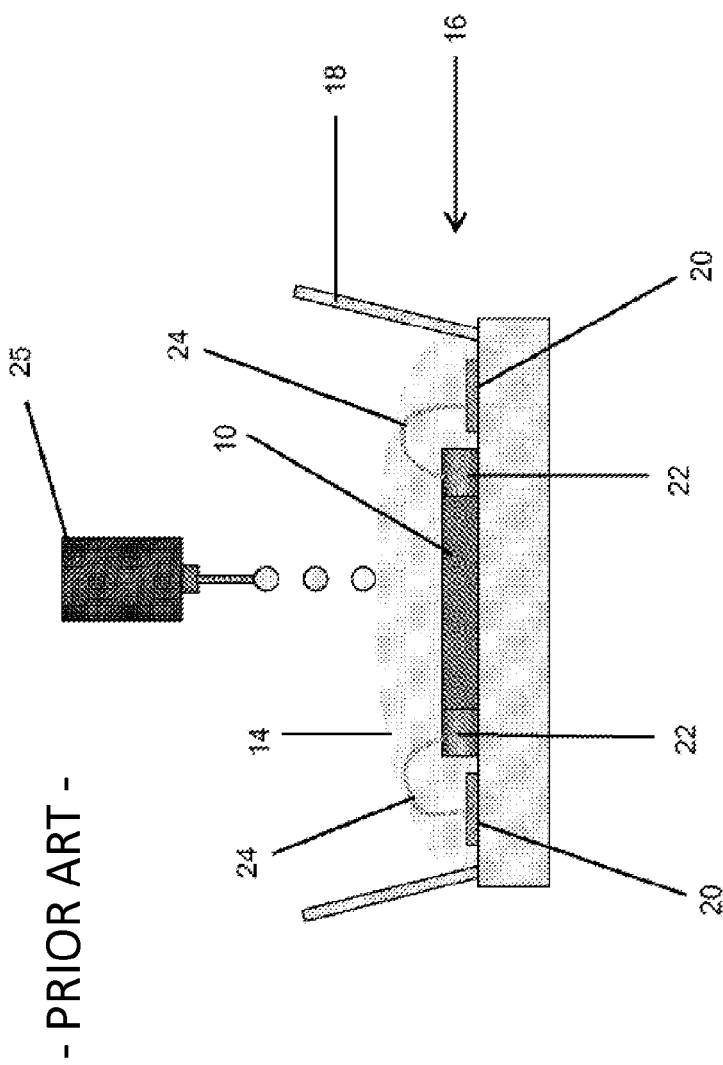
FIG. 3 depicts a method of coating fluorescent substance at the existing chip unit PKG level.

Referring now to FIG. 3, the application of WSL 14 is schematically shown. It is understood that dispenser 25 can be used to apply some or all of the layers provided hereunder. Specifically, dispenser 25 can be used to apply an adhesion layer over set LED chips 10, a conformal coating over the adhesion layer, and a protective/passivation layer over the conformal coating. In any event, as shown, there is lead frame 16 including cup 18 and the LED chip 10 is attached in the center of the cup, and the metal pad 20 and lead frame 22 are connected by the wire bond 24. WSL 14 (an adhesion layer and a fluorescent substance plus silicon layer), which fits to the wavelength of the corresponding chip 10, and in which it is designed in the LED chip surface in order to form the white target color output, is coordinated with dispensing. This described chip level fluorescent substance coating technology has several problems.

First, because of the thick coating film (over the minimum 300 um) of the fluorescent substance plus silicon, the optical mean free path is changed according to the LED chip surface location and the color deviation is caused (in other words, binning phenomenon). When it designs optically, this color deviation occurrence brings many elements.

Second, the fluorescent substance coating process is not conducted at the wafer level but is done at the chip level. As a result, the separate package material and process cost are additionally generated. Moreover, the chip cost of the inferior chip is generated by the white color output coordinate deviation after the package process. The sorting process is classified with chips within wafer accompanied according to the same wavelength band because the wavelength distribution is quantified in advance according to the chip level coating. In this case, the long process time and equipment investment cost, etc., are generated. The separate sorting process is unnecessary if the fluorescent substance application process of each unit chip is conducted at the wafer level. Since it is not the package level, and the white color output coordinate is already obtained from the unit wafer level, the separate package process and material cost are not generated in addition to the inferior chip performance variation.

As indicated above, under the present invention, the white light-emitting diode manufacturing method performs the white light-emitting diode manufacturing process in the wafer level differently than the chip level packaging method. In particular, in the described lower-stage wafer level (after the wavelength data of each chip is measured in advance), in order to control the fluorescent substance (yellow, blue, green) combination ratio, in which it is appropriate for each unit chip for the corresponding for each wavelength, accurately and radiate the white light in the wafer level according to each chip, the appropriately coated film is made with fluorescent substance plus silicon by using the dispensing method. In this way, the fluorescent substance conformal coating in which it has the thickness fixed, and is thin in the chip surface, is the basis of the possible method (chip level conformal coating: CLCC). In the present invention, the meaning of the wafer level points to the wafer state that discrete chips do not occur before the dicing process.

Figure 4:
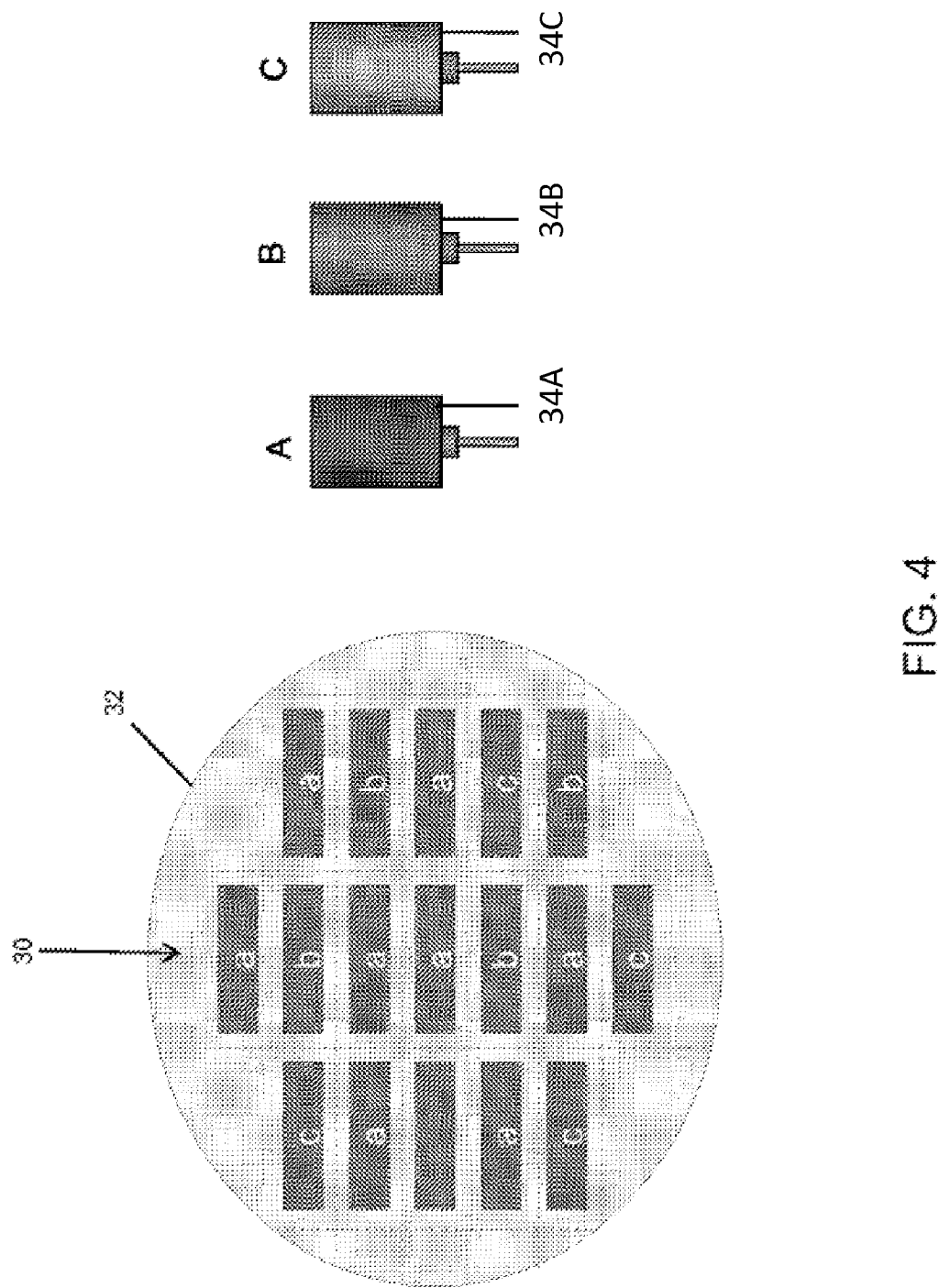
FIG. 4 depicts a graphic representation of a chip level conformal coating (CLCC) mode in the wafer level.

In FIG. 4, an additional feature of the present invention is schematically shown. In order to implement the target white color output coordinate in which it is identical about all chips 30 in wafer 32, a proper fluorescent substance combination ratio in which it has to be coated in each unit chip by using the result of measuring the wavelength of all chips 30 is determined. For example, the combination ratio of A in case of the wavelength a, the combination ratio of B in case of the wavelength β, and the combination ratio of C in case of the wavelength γ is applied. Dispensers 34A-C corresponded to the multiple combination ratio and three coating materials are prepared. Each dispenser 34A-C is filled with the fluorescent substance of the respectively different combination ratio A, B, or C.

As seen in FIG. 4, dispenser 34A-C makes the coated film (fluorescent substance plus silicon material) in which it corresponds to each unit chip while at the wafer level by the dispensing method. Therefore, it is comprised of the fluorescent substance conformal coating in the adhesion layer that was previously applied to the top surface of each LED chip. In this way, the white LED chip is ultimately implemented in the wafer level through the fluorescent substance coating. Under the present invention, three examples in which it independently coats the fluorescent substance plus silicon material in the wafer level according to each unit chip 30 are proposed.

Figure 5:
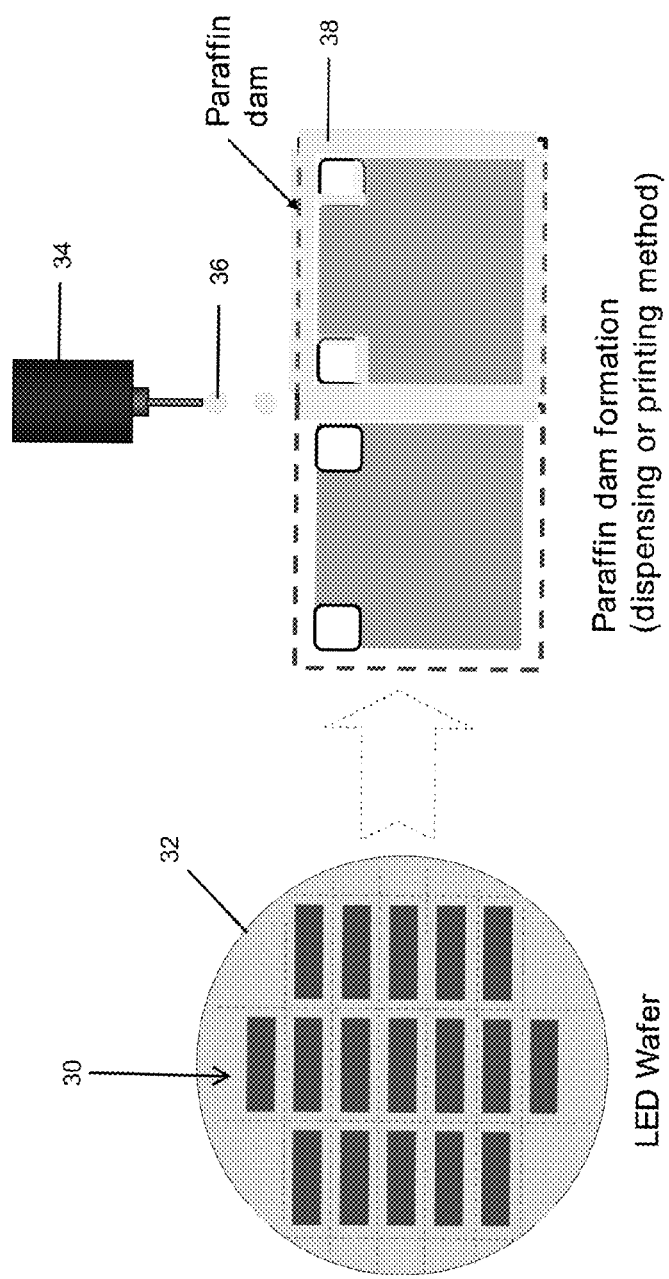
FIG. 5 depicts a method of providing the guide dam in a scribe line and metal pad part in the wafer level through a paraffin print and coating the fluorescent substance plus silicon according to each chip with dispensing in a CLCC implementation.

The first example is shown in FIG. 5. In this case, the scribe line between chips 30 within wafer 32 prints a material that includes paraffin 36 (possibly along with others). This prevents the fluorescent substance material from being coated in the scribe line. Next, the metal pad part prints a material including paraffin 36, etc., along the pad line. As to this, the fluorescent substance plus silicon material does not penetrate into the pad part in the dispensing process. Now, the thickness of the coating film becomes about 100 um in the case of a material including paraffin by printing method. A major function of the paraffin material is as a guide dam 38. As to the guide dam 36, the fluorescent substance plus silicon material prevents a coating. Accordingly, in the wafer level, the coating is possible at each chip corresponding to the fluorescent substance plus silicon material of the different combination ratios for the target white light output. The configuration of this embodiment is as follows:

(1) Measure the wavelength of each diode chip in the wafer level;

(2) Determine the combination ratio of the proper fluorescent substance (yellow, red, green) for making the white target color output coordinate with the measured blue wavelength general classification and silicon;

(3) Form the guide dam in the scribe line between all chips and the outside of the pad within the LED chip wafer as shown in FIG. 5 using a material including paraffin by being made with the line printing (or dispensing);

(4) Coat the fluorescent substance in which it has the combination ratio appropriate for each chip wavelength within the wafer it implements, the white target color output coordinate, and the silicon material for the adhesive force with dispensing; and (5) Hard cure the fluorescent substance plus silicon material.

Figure 6:
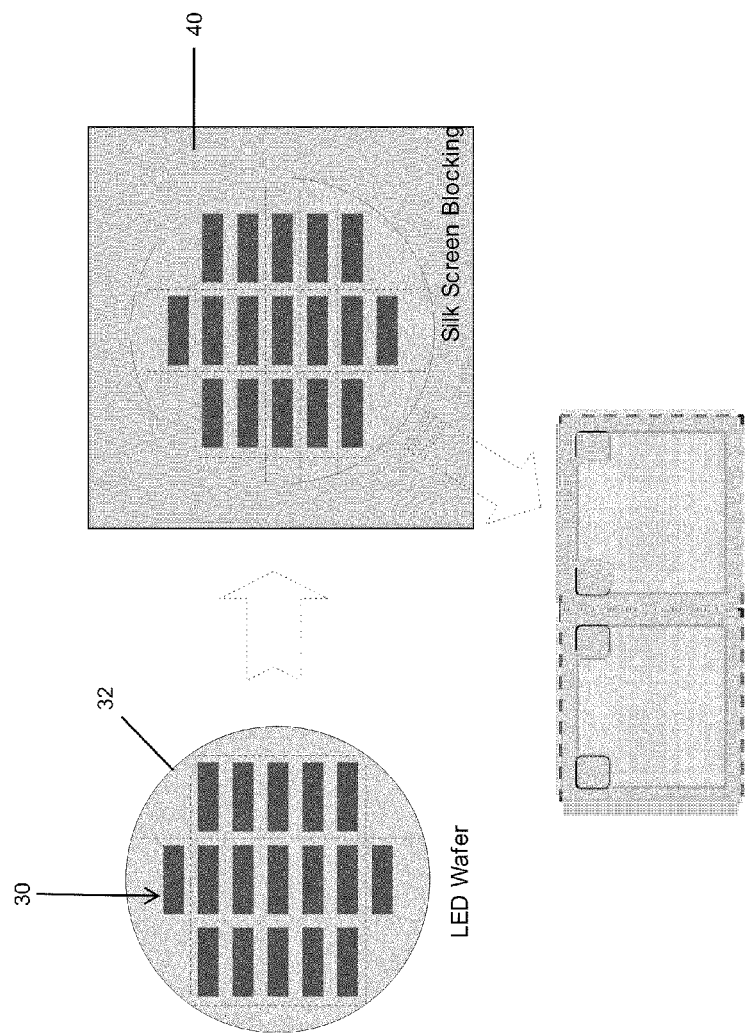
FIG. 6 depicts a method of making a fluorescent substance plus silicon according to each chip with dispensing after making the scribe line and metal pad part with blocking by using the silk screen or the metal mask in the CLCC implementation.

The second example is show in FIG. 6. In this embodiment, the fluorescent substance plus silicon material is able to infiltrate in dispensing through blocking the scribe line between chips 30 within wafer 32 and a metal pad part by using the silk screen or the metal mask 40, etc. After a silk screen blocking process 40, the fluorescent plus silicon material can be fit to the corresponding wavelength of each unit chip 30 with the dispensing method and the fluorescent substance plus silicon material is coated on each chip 30 in the wafer level. The configuration of this embodiment is as follows:

(1) Measure the wavelength of each comprised diode chip at the wafer level;

(2) Determine the combination ratio of the proper fluorescent substance (yellow, red, green) for making the white target color output coordinate with the measured blue wavelength general classification and silicon;

(3) Block the scribe line and pad part in each chip within the wafer as shown in FIG. 6 by using the silk screen and metal mask;

(4) Coat the fluorescent substance in which it has the combination ratio appropriate for each chip wavelength within the wafer it implements, the white target color output coordinate, and the silicon material for the adhesive force with dispensing; and (5) Hard cure the fluorescent substance plus silicon material.

Figure 7:
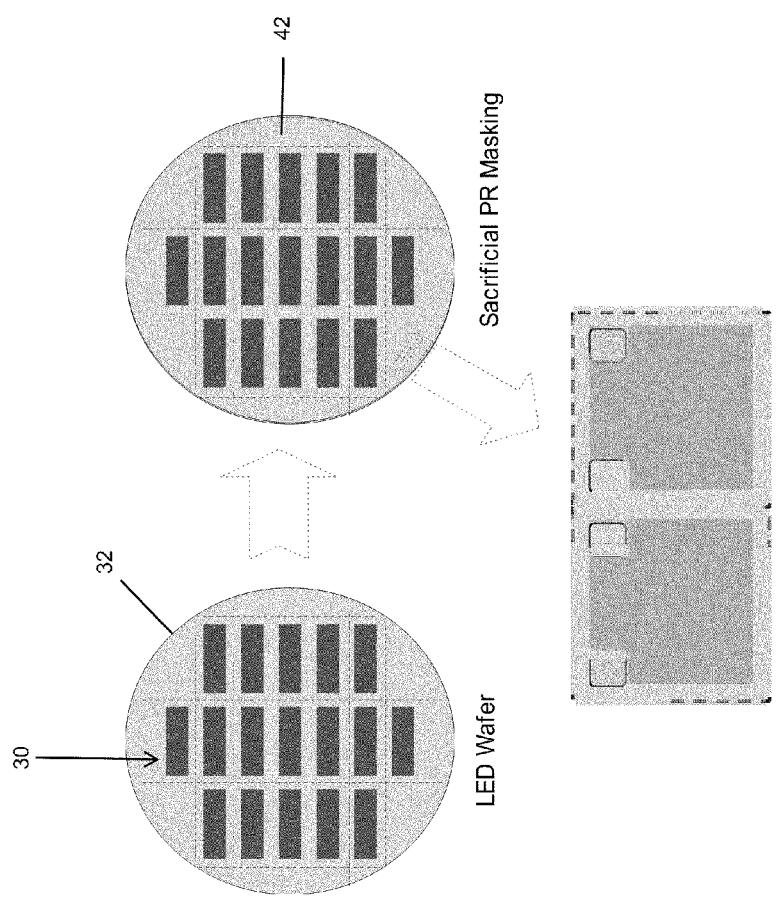
FIG. 7 depicts a method of making the fluorescent substance plus silicon according to each chip with dispensing after making the scribe line and metal pad part with masking by using the sacrificial photo resist or the organic compound in the CLCC implementation.

One additional technique is shown in FIG. 7. In this embodiment, the fluorescent substance plus silicon material is able to infiltrate by being dispensed between chips 30 within wafer 32 and the metal pad part by using the sacrificial layer photo resist material 42 or organic compound. Thus, after the masking process, the material fits to the corresponding wavelength of each unit chip with the dispensing method and the fluorescent substance plus silicon material is coated on the chip in the wafer level. The configuration of this embodiment is as follows.

(1) Measure the wavelength of each comprised diode chip in the wafer level;

(2) Determine the combination ratio of the proper fluorescent substance (yellow, red, green) for making the white target color output coordinate with the measured blue wavelength general classification and silicon;

(3) Mask the scribe line and pad part in each chip within the wafer as shown in FIG. 7 by using the sacrificial photo resist, etc.;

(4) Coat the fluorescent substance which has the combination ratio which is appropriate for each chip wavelength within the wafer it implements, the white target color output coordinate, and the silicon material for the adhesive force with dispensing;

(5) Cure the fluorescent substance plus silicon material in the oven with the hard curing; and (6) Remove the sacrificial photo resist of the scribe line and pad part.

Figure 8:
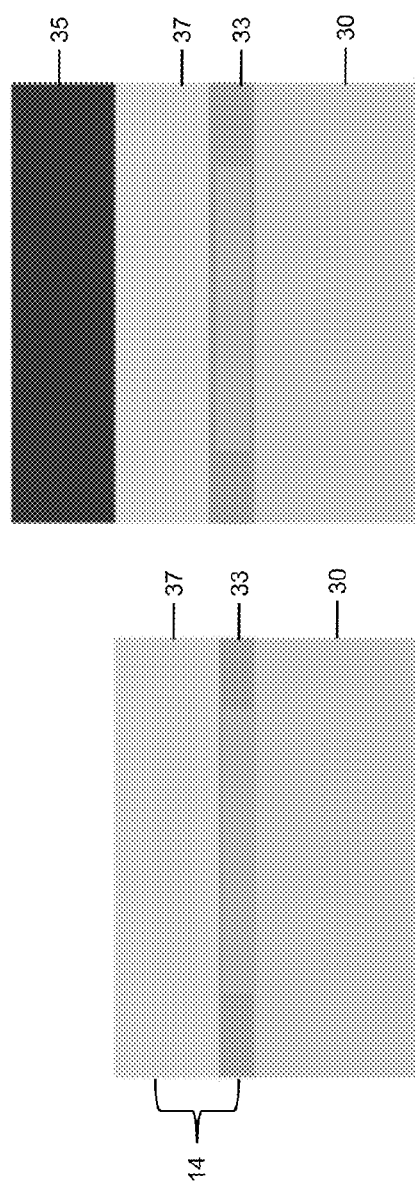
FIG. 8 depicts an LED chip as coated with a wavelength shift layer and optional protective layer.

Referring to FIG. 8, a more detailed diagram of a processed LED chip according to an embodiment of the present invention is shown. WSL 14 is shown applied over LED chip 30. The application of WSL 14 is typically accomplished as shown and described above in conjunction with FIGS. 1-7 (e.g., measuring wavelength of light output for conformal coating, isolating an area of LED chip, applying adhesion layer to LED chip, applying conformal coating over adhesion layer, etc.). In a typical embodiment, WSL 14 comprises adhesion layer 33 applied over LED chip 30 and conformal coating 37 applied over adhesion layer 33. Adhesion layer comprises an adhesive selected from a group consisting of: a silicon resin, an epoxy resin, an organic polymer, and a glass resin. Conformal coating 37 is typically prepared and applied as described above by having a phosphor ratio comprised of at least one of the following colors: yellow, green, or red, the particular ratio being based on a measured wavelength of light output by LED chip 30. FIG. 8 also shows that additional protective/passivation layer 35 can be applied (e.g., via dispenser(s) of FIGS. 3-4) to provide protection for conformal coating 37. In a typical embodiment, the passivation layer can comprise an adhesive selected from a group consisting of: a silicon resin, an epoxy resin, an organic polymer, and a glass resin.

Thus, as described herein, under the present invention, the white light-emitting diode manufacturing method performs the white light-emitting diode manufacturing process in the wafer level and is different from the used chip level packaging method. In detail, in the description lower-stage wafer level, after the wavelength data of each chip is measured in advance, in order to control the fluorescent substance (yellow, blue, green) combination ratio appropriate for each unit chip for the corresponding wavelength accurately, and radiate the white light in the wafer level according to each chip, the fit fluorescent substance is made with dispensing. In this way, the fluorescent substance conformal coating in which it has the thickness fixed and thin in the chip surface is the basis of the possible method (chip level conformal coating: CLCC). The invention effects such as the following can be observed.

First, the white light diode processing yield is increased by the color deviation reduction between the chips because the suitable fluorescent substance plus silicon material for the white formation is adjusted in the wafer level for each unit chip it coats.

Second, the separate sorting process is certainly not needed since the fluorescent substance coating process is made at the discrete chip unit in the wafer level. Consequently, the total process time is shortened.

Third, the process cost and investment cost can be reduced, since it is not at the PKG level and the white color output coordinate is already obtained from the unit chip at the wafer level. The separate PKG process and material cost are not generated. Therefore, the production equipment requirements decrease in investment and white light diode chip management expenses go down since the white light chip is manufactured at the wafer level.

In an alternative embodiment, a correspondence is easy through the COM (chip on module) in which we use the flip chip mode and the COB (chip on board), since the white light diode chip is completed for each chip at the wafer level. As a result, since existing processes, including the separate die attachment, wiring, the fluorescent substance coating, etc., can be skipped, the process cost, the material cost, etc., can be reduced.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method for manufacturing a light emitting diode (LED), comprising:
   taking a measurement for a set of LED chips;
   applying an adhesion layer over the set of LED chips;
   isolating an area of the set of LED chips using at least one of:
   paraffin wax, a silk screen, and a photo resist;
   applying a conformal coating to the isolated area over the adhesion layer, the conformal coating having a phosphor ratio that is based on the measurement; and
   converting a light output of the set of LED chips to white light using the conformal coating.

2. The method of claim 1, the adhesion layer comprising an adhesive selected from a group consisting of: a silicon resin, an epoxy resin, an organic polymer, and a glass resin.

3. The method of claim 1, the measurement comprising a measurement of a wavelength of the light output by the set of LED chips.

4. The method of claim 1, further comprising applying a passivation layer over the conformal coating.

5. The method of claim 1, the set of LED chips comprising a blue set of LED chips.

6. The method of claim 1, the set of LED chips comprising an ultra-violet set of LED chips.

7. The method of claim 1, the conformal coating having a phosphor ratio comprised at least one of the following colors: yellow, green, or red.

8. The method of claim 1, the set of LED chips being disposed on a wafer with a plurality of other sets of LED chips, the conformal coating being applied to the wafer.

9. A method for manufacturing a light emitting diode (LED), comprising:
   measuring a wavelength of a light output by a set of LED chips;
   applying an adhesion layer over the set of LED chips, the adhesion layer comprising an adhesive selected from a group consisting of: a silicon resin, an epoxy resin, an organic polymer, and a glass resin;
   isolating an area of the set of LED chips using at least one of: paraffin wax, a silk screen, and a photo resist;
   applying a conformal coating to the isolated area of the set of LED chips, the conformal coating having a phosphor ratio that is based on the wavelength, and the phosphor ratio comprised of at least one of the following colors: yellow, green, or red; and
   converting the light output of the set of LED chips to white light using the conformal coating.

10. The method of claim 9, further applying a passivation layer over the conformal coating.

* * * * *